United States Patent [19]

Sugiura et al.

[11] Patent Number: 4,927,266

[45] Date of Patent: May 22, 1990

[54] OPTICAL SIGNAL GENERATING APPARATUS AND OPTICAL POWER METER CALIBRATING SYSTEM USING THE SAME

[75] Inventors: Itsuo Sugiura; Yutaka Nishida; Kaoru Ito; Toshiyuki Ozaki, all of Tokyo, Japan

[73] Assignee: Anritsu Corporation, Tokyo, Japan

[21] Appl. No.: 283,474

[22] PCT Filed: Mar. 30, 1988

[86] PCT No.: PCT/JP88/00316

§ 371 Date: Nov. 29, 1988

§ 102(e) Date: Nov. 29, 1988

[87] PCT Pub. No.: WO88/07700

PCT Pub. Date: Oct. 6, 1988

[30] Foreign Application Priority Data

Mar. 30, 1987 [JP] Japan .................................. 62-76768
Jul. 31, 1987 [JP] Japan .................................. 62-193069

[51] Int. Cl.$^5$ ............................. G01J 1/08; G01J 1/10
[52] U.S. Cl. .................................. 356/243; 250/205; 356/73.1; 356/218
[58] Field of Search ................... 356/218, 243, 73.1; 250/205, 252.1 A

[56] References Cited

U.S. PATENT DOCUMENTS 4,378,490 3/1983 Luigi ........................ 250/205 X

FOREIGN PATENT DOCUMENTS 50-81695 7/1975 Japan .
56-87018 7/1981 Japan .
56-154174 11/1981 Japan .
61-156329 9/1986 Japan .
61-215518 9/1986 Japan .

OTHER PUBLICATIONS

Tayuki Toshiharu and Two Others (Authors) "Kogakuteki Sokutei Handbook" Jul. 25, 1981, p. 416.
"The Anritsu Technical" No. 53, Mar. 1987, pp. 26 to 32.

Primary Examiner—Vincent P. McGraw
Attorney, Agent, or Firm—Frishauf, Holtz, Goodman & Woodward

[57] ABSTRACT

In an optical signal generating apparatus of this invention, output light from a light source driven by a light source driver is externally output from an optical receptacle through a variable optical attenuator. An output monitor unit can be detachably connected to the optical receptacle through an optical connector. When an absolute level of the output light is to be set, a CPU compares a set value from an output level setting unit with an output value from the output monitor unit and controls the variable optical attenuator and the light source driver so that a comparison error becomes zero. The CPU maintains the above control of the variable optical adjuster and the light source driver so that the light is output to be the desired level set by the output level setting unit even after the output monitor unit is disconnected from the optical receptacle including the timing at which the comparison error becomes zero. An optical power meter calibrating system of this invention includes the above optical signal generating apparatus as a stabilized light source. In the optical power meter calibrating system, in place of the output monitor unit, a standard optical power meter and an optical power meter to be calibrated are selectively, detachably connected to perform calibration.

12 Claims, 6 Drawing Sheets

OPTICAL SIGNAL GENERATING APPARATUS AND OPTICAL POWER METER CALIBRATING SYSTEM USING THE SAME

TECHNICAL FIELD

The present invention relates to an optical signal generating apparatus and, more particularly, to an optical signal generating apparatus for outputting optical power equivalent to an externally set optical power output level set value and an optical power meter calibrating system using the same.

BACKGROUND ART

Recently, along with development of an optical communication system, middle/small-capacity transmission systems from a public communication system to an optical LAN (Local Area Network) system used in a private enterprise or the like have been increasingly put into practical use. Therefore, a field of optical measuring instrument is expected to be developed in consideration of the above situation.

A stabilized light source used in such a system is conventionally designed to satisfy optical output stability to cope with an application such as optical loss measurement or a fusing light source for an optical fiber fusion splice. However, a demand has arisen for an optical signal generator capable of varying an output power level and guaranteeing output level accuracy in order to respond to various needs as a light source.

On the other hand, optical power meters have been widely used along with recent rapid development of an optical industry, so that each user has a considerable number of optical power meters. In such a situation, a demand has arisen for maintaining accuracy of an optical power meter, i.e., accurately measuring a value of optical power with high reproducibility. Therefore, calibration of an optical power meter has attracted a great deal of attention.

Conventionally, calibration of an optical power meter is entrusted to a manufacturer of the meter, or if a traceability system is established in a company holding the meter, calibration is performed in a calibration department of the system. If calibration is entrusted to the manufacturer, however, a long time period and a transportation cost of an instrument are necessary for calibration, resulting in inconveniences. On the contrary, if calibration is performed using a standard in the company holding the meter, large scale equipment must be installed in order to maintain the standard. Currently, however, not all companies can have their own calibrating equipment.

An optical signal generating apparatus introduced in "The Anritsu Technical", No. 53, Mar. 1987, PP. 26 to 32 (issued by ANRITSU CO., LTD. of Japan) as an example of the above conventional optical signal generators adopts a circuit arrangement as shown in FIG. 1. That is, in FIG. 1, beam emitted from a light-emitting element, e.g., laser diode 1 is input to beam splitter 3 through continuous optical attenuating element 2. The beam passing through splitter 3 is attenuated by step optical attenuating element 4 to be a desired optical power level set value externally set by optical level setting circuit 9 to be described later. The output beam attenuated to be the predetermined value by element 4 is input to output fiber 5 and output from an output terminal, e.g., optical receptacle 6.

Meanwhile, beam split by splitter 3 is received by photodetector 7 and then converted into an electrical signal proportional to a received light level by O/E (Optical/Electrical converting) amplifier 21. The electrical signal is input as monitor output information to motor driver 11, and set information from D/A converter 10 is compared with the monitor output information by driver 11. As a result of comparison, driver 11 outputs a control signal to motor 12. Then, motor 12 for varying an attenuation amount of continuous optical attenuating element 2 operates to perform a power fine adjustment of the output beam from receptacle 6, and an optical power level equivalent to the set value set by setting circuit 9 is output.

Converter 13, driver 14 and motor 15 constitute a control circuit for changing the attenuation amount of step optical attenuating element 4 stepwise, and the set level value set by setting circuit 9 is displayed on display 20.

The beam emitted from laser diode 1 is received by monitoring photodetector element 16, and constant beam is always output by a stabilizing feedback loop consisting of element 16, amplifier 17, comparator 18, and driver 19.

Microprocessor (CPU) 8 connected to D/A converters 10 and 13, display 20, and setting circuit 9 through bus 0 performs predetermined control required for the entire system.

In such a conventional optical signal generating apparatus, however, an absolute value output level of the optical power after beam splitter 3 is not compensated for. Therefore, in the conventional apparatus, an error is produced in the optical power level of the output beam from receptacle 6 with respect to the set value set by setting circuit 9 due to a fiber loss at output fiber 5, contamination on the end face thereof, reflection on the end face, and factors associated with time such as an ambient temperature change. In addition, if the attenuation amount of element 4 changes due to contamination or the like, the optical power level of the output beam cannot be corrected because the change is not detected, resulting in output variations.

In this apparatus, a fine adjustment of the output optical beam is performed by continuous optical attenuating element 2 driven by motor 12. However, if resolution with high accuracy is required as in a calibrating system for the optical power meter, control finer than the fine adjustment performed by element 2 is sometimes desired.

FIGS. 2A, 2B and 3 are block diagrams showing a conventional system for calibrating the optical power meter. The conventional system will be described with reference to these drawings. In calibration of the optical power meter, instruments are connected in basically two manners as shown in FIGS. 2A and 2B.

A first system shown in FIG. 2A is the most basic one in which standard optical power meter 102 and optical power meter to be calibrated 103 are alternately connected to the output terminal of light source 101 through optical connectors 128 and 129a or 129b, thereby obtaining a calibrated value from a difference between indicated values of the both.

In this system, however, an optical signal output from light source 101 must be maintained constant to satisfy predetermined calibration precision while the two optical power meters are switched to perform calibration. In addition, if stability of the signal source is unsatisfactory, the above comparison must be repeated a plurality of times.

Therefore, calibrating the optical power meter using the optical signal generating apparatus as shown in FIG. 1 as light source 101 poses a serious problem of precision.

In a second system shown in FIG. 2B, the optical signal output from light source 101 is branched by optical branch circuit 104, and two branched optical signal outputs are detected by standard optical power meter 102 and optical power meter to be calibrated 103 through optical connectors 128a and 129a, and 128b and 129b, , respectively. At the same time, indicated values of both the optical power meters are obtained, thereby obtaining a calibrated value from a difference between indicated values of the both. In this case, a ratio (branch ratio) between the two optical signal outputs from optical branch circuit 104 must be accurately measured beforehand. That is, assuming that a ratio between standard output light P42 and calibrating output light P43 from circuit 104 is $\gamma$ and the indicated values of power meters 102 and 103 are P2 and P3, respectively, deviation factor $\epsilon$ of optical power meter to be calibrated 103 with respect to standard optical power meter 102 is given by the following equation:

$$\epsilon = (p3/\gamma p2) - 1 \text{ (where } \gamma = P43/P42)$$

However, in order to perform calibration with high precision as described above, both the first and second systems shown in FIGS. 2A and 2B have the following problems. That is, in the first system shown in FIG. 2A, the problem is light source 101, i.e., stability of the optical signal output during measurement. In the second system shown in FIG. 2B, the branch ratio of optical branch circuit 104 must be accurately measured in addition to the above problem. Especially when the second system in FIG. 2B is adopted to calibrate the optical power meter, it is difficult to stably maintain the branch ratio over a long time period because circuit 104 is arranged such that the branch ratio of the two outputs is adversely affected even by a very small change in element surface state. Therefore, in order to maintain a high calibration precision, branch ratio $\gamma$ must be frequently measured, resulting in frequent maintenance of the system.

In order to eliminate the above drawbacks of the two calibrating systems shown in FIGS. 2A and 2B, a third system shown in FIG. 3 is proposed. A shown in FIG. 3, the optical signal output from light source 101 is branched into monitoring output light 106 and calibrating output light 107 by optical branch circuit 104. Since variations in calibrating output light 107 can be monitored by detecting monitoring output light 106 branched by circuit 104, a calibrated value of optical stability of light 107 can be corrected if necessary.

In the system shown in FIG. 3, since monitoring output 106 is used as merely a reference signal, the branch ratio need only maintain a predetermined value only during a predetermined time interval in one measurement. Therefore, no absolute value of the branch ratio is required.

In calibration of the optical power meter, any of the following three calibration conditions is generally adopted.

(i) A deviation of an accurate value of a standard instrument with respect to a specific designated value of an instrument to be calibrated (most generally, a full scale value of each measurement range) is obtained. This is scale calibration based on the instrument to be calibrated. A so-called "scale calibration" means this condition and is widely adopted in calibration of an analog display meter.

(ii) A deviation of an indicated value of an instrument to be calibrated with respect to an accurate value of a standard instrument corresponding to a specific designated value of the instrument to be calibrated is obtained. This is scale calibration based on the standard instrument in which a deviation of each full scale value can be advantageously directly obtained when the instrument to be calibrated has an over range scale in each measurement range.

(iii) When a strictly specified value is not used and calibration is performed near a substantially designated value, a deviation of an instrument to be calibrated with respect to an accurate value of a standard instrument is obtained. This can be called calibration using a calibration coefficient and easily adopted when linearities of both the two optical power meters are guaranteed.

In the calibration conditions of (i) and (ii), an output must be accurately set to be a designated level with precision corresponding to indicating resolution of the standard optical power meter or predetermined calibration precision. However, it is often difficult to accurately set the output by only setting the level of the optical signal source especially in a measurement of an optical fiber system in which an optical fiber end level changes in accordance with the characteristics of a used optical fiber or the type of a used optical connector. Therefore, the optical signal output must be controlled in correspondence with the indicated value of the standard optical power meter. In addition, the set output level with respect to the standard optical power meter must be maintained with stability corresponding to the predetermined calibration precision until comparison of the two optical power meters is completed.

In order to perform calibration with high precision in the above conventional optical power meter calibrating system, the optical signal output within a measurement time interval output from the optical signal generating apparatus as a light source must be stabilized and the branch ratio of the optical branch circuit must be accurately measured. However, calibration cannot be performed with sufficient precision unless the level of the optical signal output is set and stabilized with satisfactory precision.

DISCLOSURE OF INVENTION

It is, therefore, an object of the present invention to provide a novel and improved optical signal generating apparatus which can compensate for an absolute level of an optical signal output to maintain satisfactory accuracy and stability.

It is another object of the present invention to provide an optical power meter calibrating system which can arbitrarily set an optical signal output level with high precision on the basis of an input end of an optical power meter using the above optical signal generating apparatus as a stabilized light source and can calibrate the optical power meter with a simple operation and high precision by obtaining a stable output.

According to an aspect of the present invention, there is provided an optical signal generating apparatus comprising:

a light source;

light source driving means for driving the light source;

optical level adjusting means for receiving output light from the light source and adjusting the level of the output light;

optical output means for externally outputting the output light from the optical level adjusting means;

optical level setting means for setting the output light externally output from the optical output means to be a desired level;

output light monitoring means, detachably connected to the optical output means, for monitoring the output light; and control means for comparing an optical output level set signal from the optical output level setting means with an output signal from the output light monitoring means to supply a control signal for adjusting the level of the output light externally output from the optical output means to the optical level adjusting means in accordance with a comparison error, and when the comparison error becomes zero, for maintaining a value of the corresponding control signal to control such that the optical output means outputs output light of the desired level set by the optical output level setting means even after the optical output means is disconnected from the output light monitoring means.

According to another aspect of the present invention, there is provided an optical power meter calibrating system comprising;

light source;

light source driving means for driving the light source;

optical level adjusting means for receiving output light from the light source and adjusting the level of the output light;

optical output means for externally outputting the output light from the optical level adjusting means;

optical output level setting means for setting the output light externally output from the optical output means to be a desired level;

a standard optical power meter and an optical power meter to be calibrated which are selectively, detachably connected to the optical output means; and control means for comparing, when the standard optical power meter is connected to the optical output means, an optical output level set signal from the optical output level setting means with an output signal from the standard optical power meter to control the optical level adjusting means and the light source driving means so that a comparison error becomes zero, and after the comparison error becomes zero, for controlling to maintain the above control for the optical level adjusting means and the light source driving means until the standard optical power meter is disconnected to connect the optical power meter to be calibrated and calibration for the optical power meter to be calibrated is completed.

BRIEF DESCRIPTION OF THE DRAWING

The above and other objects and features of the present invention will be readily understood from embodiments to be described below with reference to the accompanying drawings in which.

BEST MODE OF CARRYING OUT THE INVENTION

A basic arrangement of an optical signal generating apparatus according to the present invention will be described below.

Figure 4:
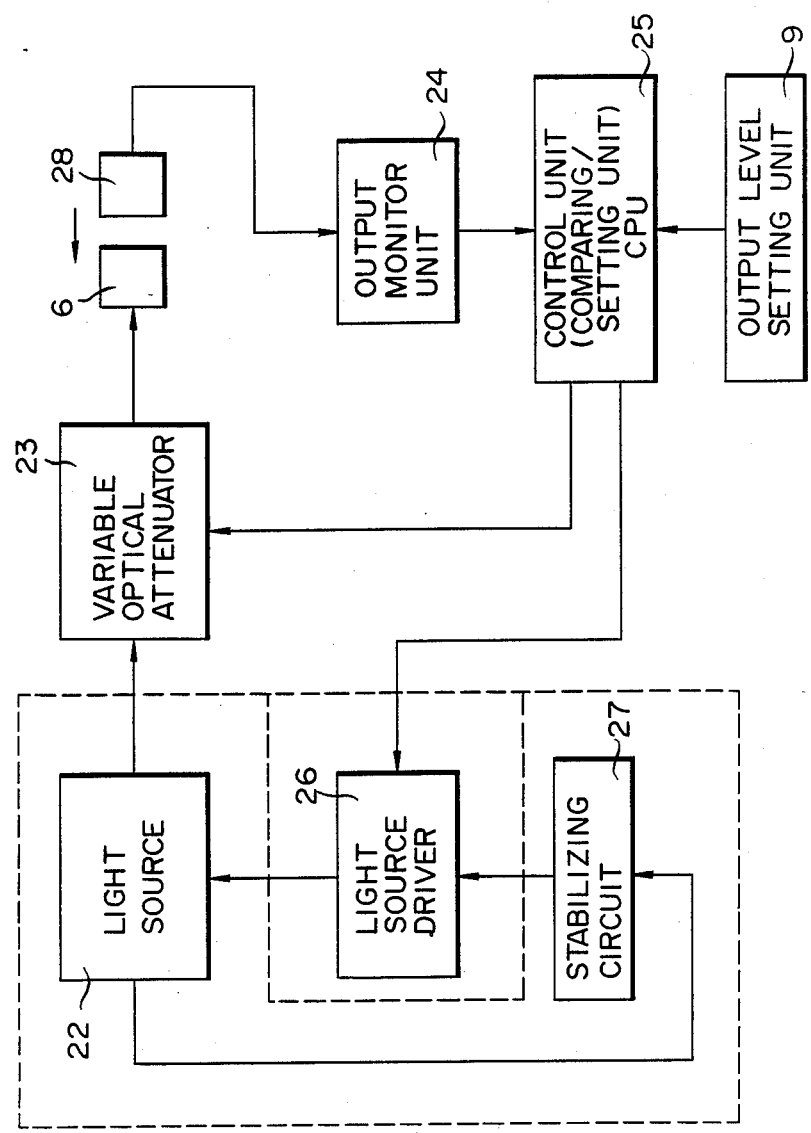
FIG. 4 is a block diagram showing a basic arrangement of an optical signal generating apparatus according to the present invention.

As shown in FIG. 4, the optical signal generating apparatus of the present invention comprises light source 22 including integrally or independently stabilizing circuit 27 for stabilizing emitted beam light, variable optical attenuator 23 for attenuating the beam emitted from light source 22 to be an output level of externally set optical power, output monitor unit 24 for extracting output beam attenuated by attenuator 23 from an output end and monitoring the optical power of the output beam, and CPU 25 as a control unit including a comparing/setting unit for comparing an output value of the output beam monitored by unit 24 with an output level set value externally set by output level setting unit 9 and adjusting/setting an attenuation amount of attenuator 23. In order to obtain finer resolution, the optical signal generating apparatus of the present invention further comprises integrally with or independently of light source 22, in addition to the above elements, light source driver 26 for receiving a fine adjustment control signal from CPU 25 and changing an output of the beam emitted from light source 22. Therefore, an output level of the output beam is detected at the output end to reduce an error with respect to the set value.

An operation of the optical signal generating apparatus having the above arrangement will be described below. That is, beam emitted from light source 22 is attenuated to be an output level of externally set optical power by attenuator 23 and output from optical receptacle 6 as output beam. When an absolute level of the output beam is to be set, optical (connector) plug 28 is connected to receptacle 6, and optical power of the output beam is input to output monitor unit 24 through plug 28. Unit 24 converts the received output beam into an electrical signal corresponding to an optical power level of the beam and sends the electrical signal to CPU 25. CPU 25 which has received a set value of desired level externally supplied from output level setting unit 9 compares the output level set value with the value of electrical signal of the output beam from unit 24. A difference obtained in comparison, i.e., an error is fed back to attenuator 23, thereby correcting an attenuation amount of the output beam from receptacle 6. A fine adjustment control signal for finely changing an output of the beam emitted from light source 22 is output from CPU 25 to light source driver 26. In order to obtain finer resolution, the beam emitted from light source 22 is finely changed using the fine adjustment control signal output from CPU 25 to perform finer control.

In this manner, the optical signal generating apparatus of the present invention having the above basic arrangement can maintain satisfactory accuracy and stability of the optical signal output with respect to the externally set output level set value.

An optical signal generating apparatus according to an embodiment of the present invention having the above basic arrangement in a more detailed manner will be described in detail below with reference to the accompanying drawing.

Figure 1:
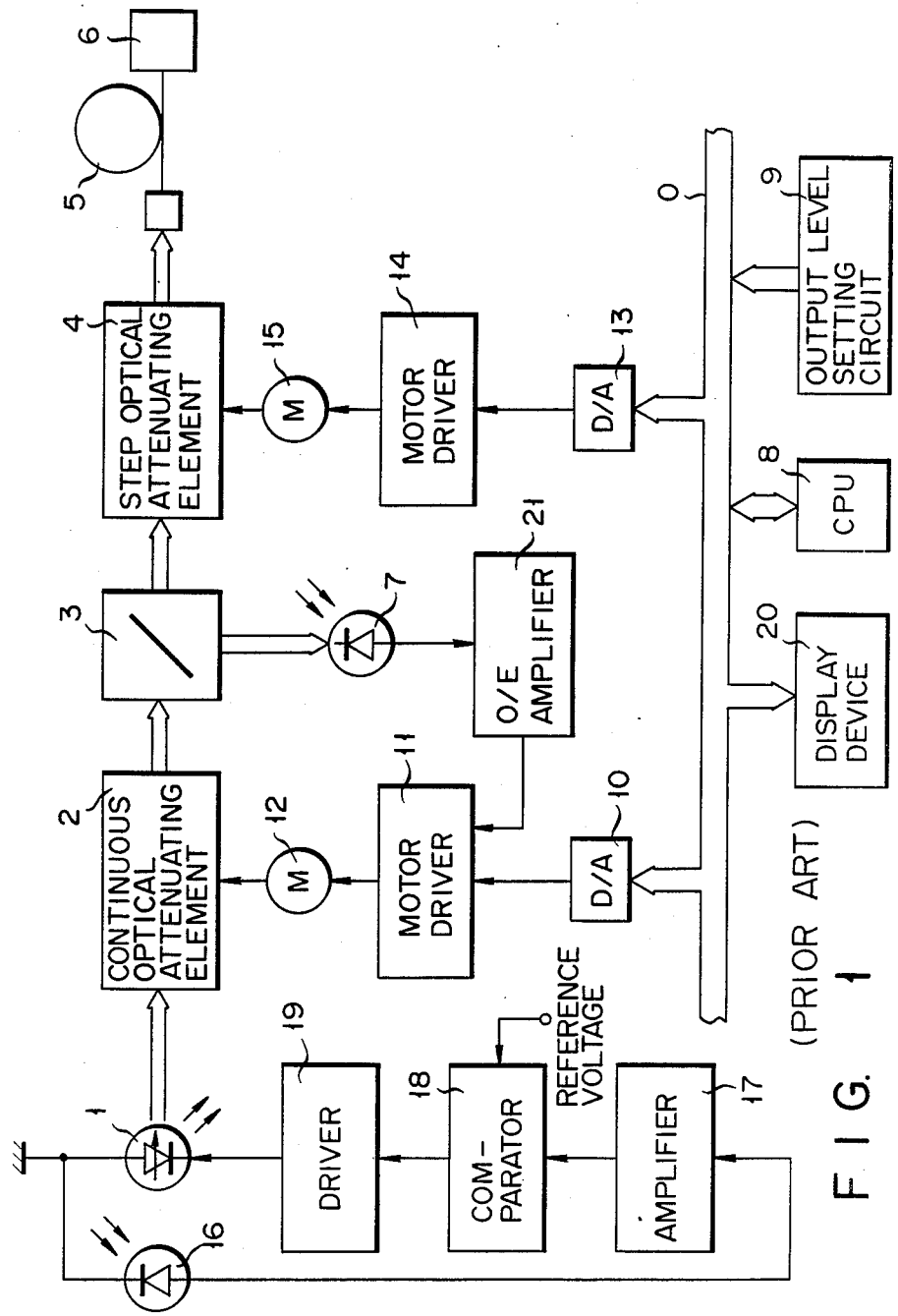
FIG. 1 is a block diagram showing a conventional optical signal generating apparatus.
Figure 2A:
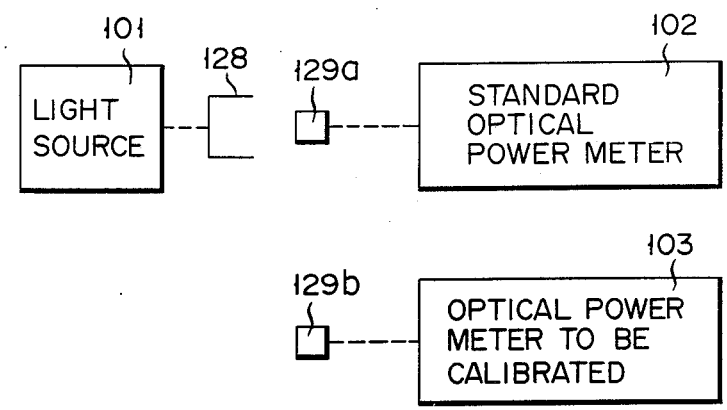
FIGS. 2A, 2B and 3 are block diagrams showing conventional optical power meter calibrating systems.
Figure 2B:
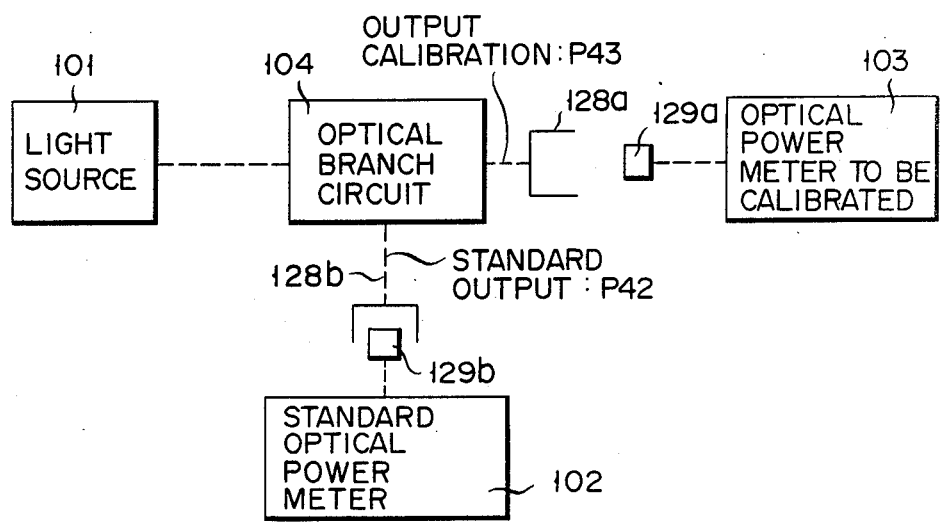
Figure 3:
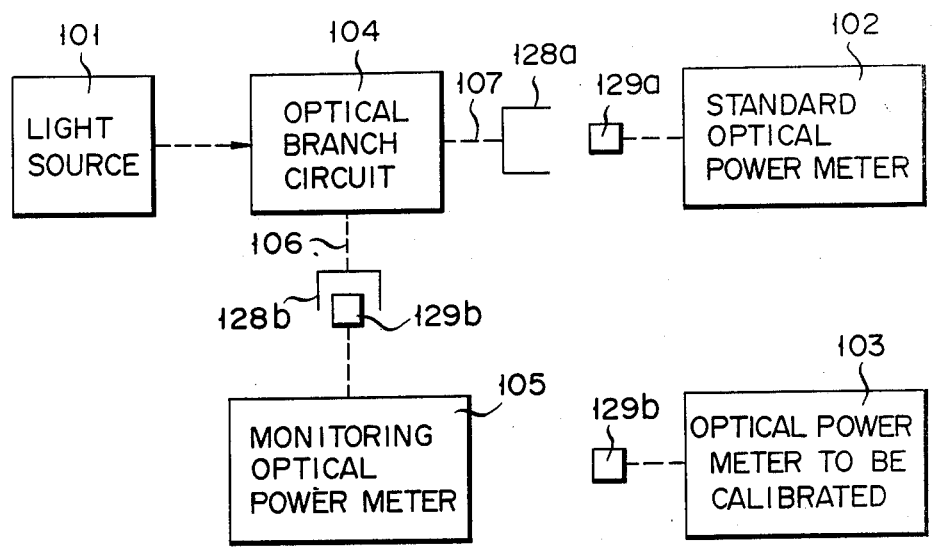
Figure 5:
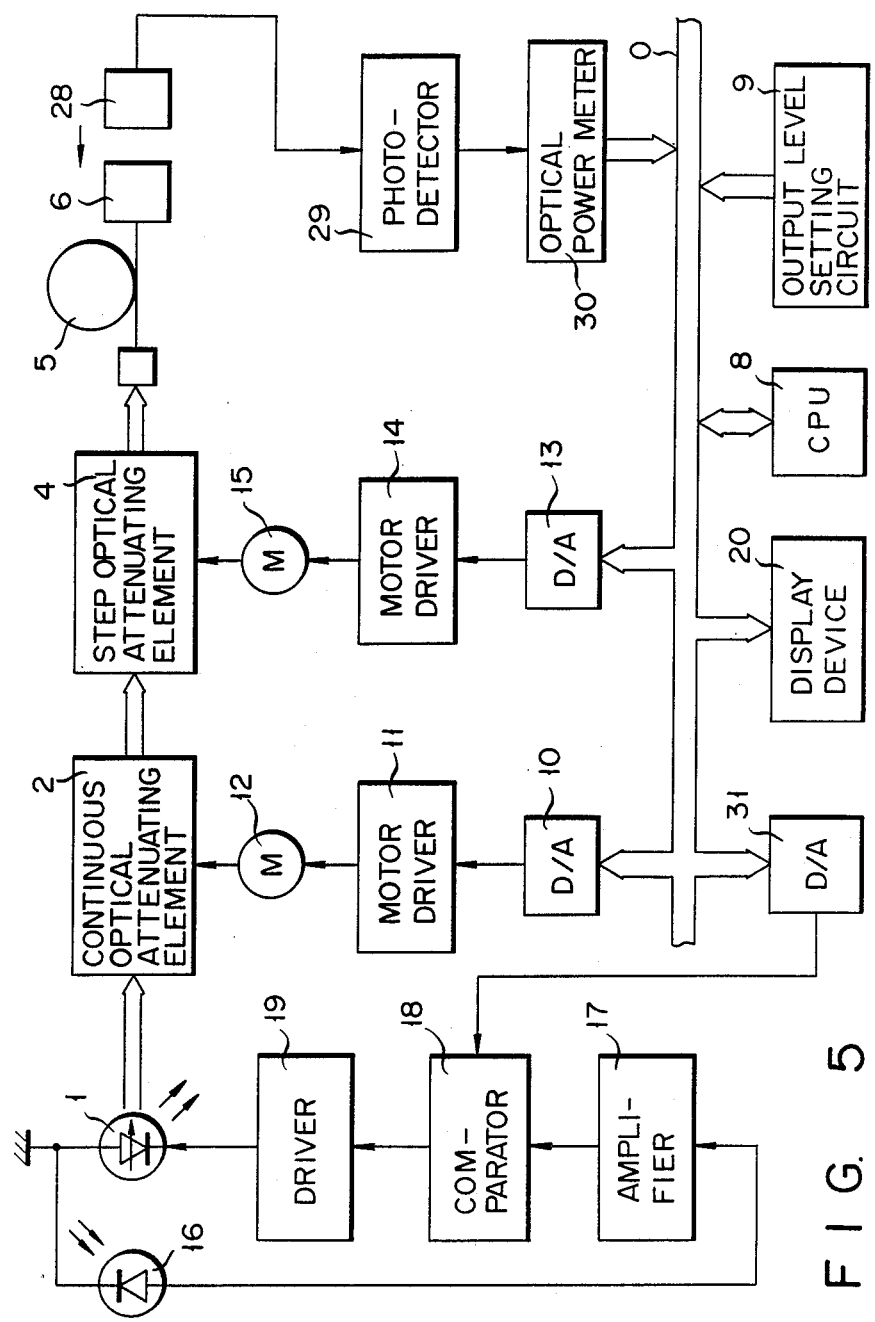
FIG. 5 is a block diagram showing an optical signal generating apparatus according to an embodiment of the present invention.

FIG. 5 shows an arrangement of the embodiment of the optical signal generating apparatus according to the present invention. In FIG. 5, reference numerals 0, 1, 2, 4 to 6, and 8 to 20 correspond to those in FIG. 1, and reference numeral 28 corresponds to that in FIG. 4. In FIG. 5, reference numeral 29 denotes a photodetector; 30, an optical power meter; and 31, a D/A converter.

When a desired optical power output level value is externally set by an operation key or the like on a panel surface (not shown), output level setting circuit 9 sends set data to CPU 8 through bus 0. CPU 8 sends data to D/A converters 10 and 13 in accordance with the set data. Signals converted by D/A converters 10 and 13 are input to motor drivers 11 and 14, respectively. Drivers 11 and 14 output control signals to motors 12 and 15, respectively, and attenuation amounts corresponding to the externally set desired output level are set in continuous optical attenuating element 2 and step optical attenuating element 4.

Beam emitted from laser diode 1 driven by a stabilizing feedback loop consisting of photodetector 16, amplifier 17, comparator 18, and driver 19 is attenuated by attenuating elements 2 and 4 and then output as output beam having the above set optical power output level from optical receptacle 6 through output fiber 5. When an absolute level of the output beam from receptacle 6 is to be set, the output beam is received by photodetector 29 through optical plug 28 connected to receptacle 6 and monitored by optical power meter 30. Detection data of the output beam from receptacle 6 monitored by power meter 30 is supplied to CPU 8 through bus 0. CPU 8 compares the detection data with the set data supplied from setting circuit 9. CPU 8 supplies error data obtained by comparison to D/A converter 10 through bus 0. As a result, error data is fed back to attenuating element 2 through driver 11 and motor 12. Therefore, attenuating element 2 corrects the attenuation amount in accordance with the error so that the optical power of the output beam from receptacle 6 becomes equivalent to the set output level.

In order to correct an amount which cannot be corrected by attenuating element 2, CPU 8 outputs error data to D/A converter 31 through bus 0. The error signal of the fine adjustment control signal converted into an analog signal by D/A converter 31 is input to comparator 18. Comparator 18 changes a reference voltage in accordance with the input error signal to finely change a drive current to be flowed to diode 1. Therefore, the beam emitted from diode 1 is finely changed to compensate for the error which cannot be corrected by attenuating element 2.

A circuit arrangement for changing the drive current of diode 1 is not limited to the above one in which the error signal is input to comparator 18. For example, the circuit may be arranged such that the error signal is added to amplifier 17. That is, the circuit can be arbitrarily arranged as long as the drive current of diode 1 is finely changed in correspondence to the error signal.

In addition, the positions of continuous optical attenuating element 2 and step optical attenuating element 4 may be switched so that the beam emitted from diode 1 is roughly attenuated by element 4 and then finely attenuated by element 2.

As described above, according to the optical signal generating apparatus of the present invention, the monitor for setting the output optical power equal to the external set value is located at the output end side to perform feedback, thereby finely changing the stabilized light source. Therefore, the following effects can be obtained.

(i) The optical signal generating apparatus can provide a light source in which an error of an optical power level at an output end is small with respect to an external set value.

(ii) Since the optical signal generating apparatus is not adversely affected by a change in attenuation amount caused by contamination of an internal optical attenuator or the like, no output variation occurs.

(iii) The optical signal generating apparatus can be used as a stabilized light source in an optical power meter calibrating system according to the second embodiment.

(iv) When a loss in an optical fiber or the like is to be measured, the optical signal generating apparatus can be used as a light source and a reception light measuring apparatus. Therefore, the number of meters can be reduced, i.e., a measurement can be performed by two meters located at the ends of the optical fiber to be measured.

An optical power meter calibrating system according to the second embodiment of the present invention using the optical signal generating apparatus of the above first embodiment will be described below.

The optical power meter calibrating system according to the present invention will be briefly described. In this system, an output from a stabilized light source is branched into a calibrating output and a monitoring output by an optical branch circuit. A variable optical adjuster and an optical output detector are inserted in calibrating and monitoring output systems, respectively. The system comprises a signal processor/controller for controlling a light passing amount of the variable adjuster and an output from the stabilized light source so that a difference between a measured value of the standard power meter connected to the calibrating output system and a value designated by a calibration level setting unit becomes zero. Therefore, calibration is performed while the standard power meter is replaced with a power meter to be calibrated to check whether an output from the optical branch circuit is kept unchanged during calibration by a monitor display.

In the optical power meter calibrating system having the above arrangement, a desired value is designated by the calibration level setting unit, and a value detected by the standard power meter is transmitted to the signal processor/controller through a GP-IB or the like to control the variable optical adjuster and the stabilized light source, so that an optical output is set equal to the desired level. The signal processor/controller controls the stabilized light source so that the optical output is maintained constant even if the standard power meter is removed. Therefore, even if the optical output from the stabilized light source is changed, the optical output value can be corrected during calibration of the power meter to be calibrated because a change amount of the optical output is displayed on the monitor display.

Figure 6:
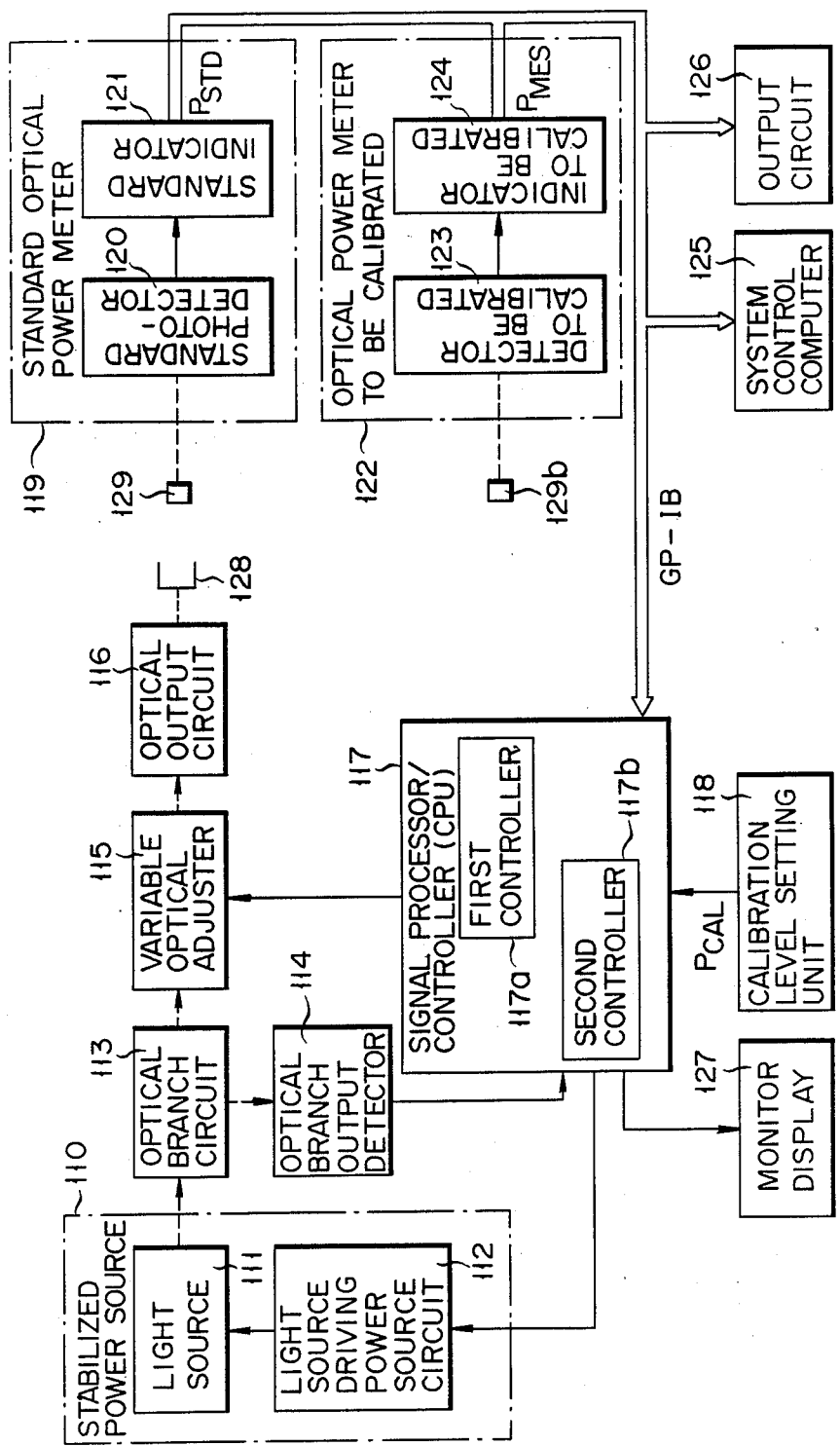
FIG. 6 is a block diagram showing an optical power meter calibrating system according to another embodiment of the present invention.

FIG. 6 is a block diagram showing the optical power meter calibrating system according to the second embodiment of the present invention. The second embodiment will be described below with reference to the drawing.

In FIG. 6, light source 111 and light source driving power source circuit 112 constitute stabilized light source 110 including the elements represented by reference numerals 1 and 16 to 19 in FIG. 5. Assume that light source 111 is stabilized by a monitor for backward output light from laser diode 1 as a light-emitting element (see FIG. 5). However, forward output light and backward output light from laser diode 1 do not completely coincide with each other with respect to a very fine output variation. In this case, an output variation having comparatively large amplitude and short period is internally stabilized in light source 110 by the backward output light monitor. Output light stabilization with higher precision is performed such that a monitoring output from optical branch circuit 113 for branching the output light from light source 110 into a calibrating output and the monitoring output is detected by optical branch output detector 114 and the detected monitoring output is fed back to light source 111 through signal processor/controller 117 and power source circuit 112. The monitoring output is displayed on monitor display 127.

Signal processor/controller (CPU) 117 comprises first and second controllers 117a and 117b to be described later. When standard optical power meter 119 is connected optical output circuit 116 to which the calibrating output from branch circuit 113 is supplied through variable optical adjuster 115, first controller 117a controls as follows. That is, CPU 117 receives a calibration level signal from calibration level setting unit 118 for externally setting a desired calibration point and an output level signal from power meter 119 and causes first controller 117a to roughly adjust adjuster 115 and finely adjust light source 110 so that a difference between both the signals becomes zero. Then, after the difference between both the signals becomes zero, in order to keep the level of output light from output circuit 116 substantially unchanged at least until standard power meter 119 is disconnected and power meter to be calibrated 122 is connected to output circuit 116 and completely calibrated, CPU 117 causes second controller 117b to supply predetermined control signals to adjuster 115 and light source 110.

Variable optical adjuster 115 may be, for example, a variable optical attenuator consisting of a step attenuator with a high attenuation amount and a continuous variable attenuator with high resolution, as shown in FIG. 5.

Optical output circuit 116 consists of a beam size adjuster in a parallel light measurement and a mode filter, a fiber exciter, or the like in a measurement of an optical fiber system.

Switching of power meters 119 and 122 to circuit 116 is performed by connectors 128 and 129a or 129b.

System operation and control will be described below assuming that scale calibration (calibration of a full scale value) of power meter to be calibrated 122 is performed.

First, calibration level $P_{CAL}$ is externally (e.g., from ten keys on a panel surface (not shown)) by calibration level setting unit 118, and then standard optical power meter 119 is connected to optical receptacle 128. An indicated value of power meter 119 is sent to CPU 117 through a bus such as a GP - IB. In place of the GP - IB, a BCD, an RS232c, or the like may be used. CPU 117 compares the designated and stored calibration level value ($P_{CAL}$) with the indicated value of power meter 119 and outputs a control signal to variable optical adjuster 115 so that the indicated value coincides with the designated value ($P_{CAL}$). If the resolution of adjuster 115 does not satisfy the predetermined measurement precision, a control signal for a small residual error is supplied to light source driving power source circuit 112 to control a bias current of laser diode 1 (see FIG. 5) of stabilized light source 110, thereby improving level controlling resolution.

After a coincidence between designated calibration level $P_{CAL}$ and the indicated value of power meter 119 is monitored, adjuster 115 is fixed, and an output from optical branch output detector 114 at this time is set as a reference value by CPU 117. At this time, monitor display 127 displays zero. Thereafter, display 127 displays an output variation value obtained after zero is set. At the same time, CPU 117 supplies the output variation value as an error control signal to adjuster 115 or power source circuit 112. That is, the variation value is automatically controlled to be zero by CPU 117, and therefore monitor 127 displays a control residual portion, i.e., the output variation amount obtained after zero is set.

In this state, since an adjustment amount of adjuster 115 is fixed, an output level of optical output circuit 116 is not changed even if circuit 116 is disconnected from power meter 122.

In this manner, the power of the beam emitted from circuit 116 is set to be designated calibration level $P_{CAL}$.

Thereafter, power meter to be calibrated 122 is disconnected and then power meter 122 is connected. As a result, error ε of an indicated value of power meter 122 can be obtained from a difference between indicated value $P_{MES}$ of power meter 122 and an accurate output value of circuit 116. That is, error ε is obtained by the following equation:

$$\epsilon = P_{CAL} - P_{MES}$$

If an input line to detector to be calibrated 123 of power meter 122 is an optical fiber, an input line to standard photodetector 120 of standard optical power meter 119 must be the same optical fiber. In this case, the connection optical fiber is desirably switched at its one end from photodtector 120 of power meter 119 to detector 123 of power meter 122 while the other end thereof is kept connected to optical receptacle 128.

When the measurement of power meter 122 is completed, the value displayed on monitor display 127 is read to check whether the output variation obtained after zero is set falls within an allowable range. If the value falls outside the range, the optical output power is recalibrated by power meter 119 or power meter 122 is corrected.

Alternatively, the indicated values of power meters 119 and 122 and the value displayed on monitor display 127 may be read by system control computer 125 to output data such as the indicated value, the variation corrected value, or error ε from output circuit 126 to, e.g., an external printer.

In order to calibrate a plurality of levels, the above operation is repeatedly performed for the respective levels.

As described above, according to the optical power meter calibrating system of the present invention, until the standard optical power meter is disconnected to connect the optical power meter to be calibrated and calibration is completed after the output optical power is fixed to the set value for calibration by the standard optical power meter, the CPU controls the optical signal output from the stabilized light source to be constant so that the output from the output circuit does not vary. In addition, even if the optical output varies, the variation amount can be corrected with respect to the power meter to be calibrated by monitoring the variation amount by the monitor display if necessary, thereby performing calibration with high precision.

Moreover, since the standard power meter and the power meter to be calibrated need not be repeatedly, alternately switched, the operation can be easily performed.

INDUSTRIAL APPLICABILITY

The optical signal generating apparatus according to the present invention can be utilized as a stabilized light source in fields of a general optical communication system (including an optical LAN) and an optical meter and can be applied to an optical power meter calibrating system.

The optical power meter calibrating system according to the present invention can calibrate an optical power meter with high precision and therefore can be utilized in a general optical industry using an optical power meter. Especially in a company which holds a large number of optical meters and in which an optical power traceability system is established and a superior standard is arranged, the system of the present can be used as a calibrating system with a practical standard level by tracing the standard optical power meter to the superior standard. If an optical power traceability of a national or company level is not established, the standard optical power meter of the system of the present invention can be used as a standard to maintain the traceability for each level.

We claim:

1. An optical signal generating apparatus comprising:
   a light source;
   light source driving means for driving said light source;
   optical level adjusting means for receiving output light from said light source and adjusting the level of the output light;
   optical output means for externally outputting the output light from said optical level adjusting means;
   optical level setting means for setting the output light externally output from said optical output means to be a desired level;
   output light monitoring means, detachably connected to said optical output means, for monitoring the output light; and
   control means for comparing an optical output level set signal from said optical output level setting means with an output signal from said output light monitoring means to supply a control signal for adjusting the level of the output light externally output from said optical output means to said optical level adjusting means in accordance with a comparison error, and when the comparison error becomes zero, for maintaining a value of the corresponding control signal to control such that said optical output means outputs output light of the desired level set by said optical output level setting means even after said optical output means is disconnected from said output light monitoring means.

2. An apparatus according to claim 1, further comprising:
   optical branching means connected between said light source and said optical level adjusting means;
   optical branch output detecting means for detecting branched output light from said optical branching means; and
   display means for displaying a detection output from said optical branch output detecting means.

3. An apparatus according to claim 1, further comprising display means for displaying the comparison error obtained by said control means.

4. An apparatus according to claim 2, wherein said light source comprises a laser diode and stabilizing means for internally stabilizing backward output light from said laser diode.

5. An apparatus according to claim 1, wherein said optical level adjusting means includes at least one of a continuous optical attenuating element and a step optical attenuating element.

6. An apparatus according to claim 1, wherein said control means supplies a control signal for adjusting the output light from said light source to said light source driving means.

7. An apparatus according to claim 1, wherein said output light monitoring means includes an optical power meter.

8. An optical signal generating apparatus comprising:
   a light source including a stabilizing circuit for stabilizing emitted beam;
   a variable optical attenuator for attenuating the beam emitted from said light source to be an externally set output level of optical power;
   an output monitor unit for extracting output beam attenuated by said variable optical attenuator from an output end side and monitoring the optical power of the output beam; and
   a comparing/setting unit for comparing an output value of the output beam monitored by said output monitoring unit with the externally set output level set value and adjusting/setting an attenuation amount of said variable optical attenuator on the basis of a comparison difference,
   wherein an output level of the output beam is detected at the output end side to reduce an error with respect to the set value.

9. An optical signal generating apparatus comprising:
   a light source including a stabilizing circuit for stabilizing emitted beam;
   a variable optical attenuator for attenuating the beam emitted from said light source to be an output level of externally set optical power;
   an output monitor unit for extracting output beam attenuated by said variable optical attenuator from an output end side and monitoring the optical power of the output beam;
   a comparing/setting unit for comparing an output value of the output beam monitored by said output monitoring unit with the externally set output level set value and adjusting/setting an attenuation amount of said variable optical attenuator on the basis of a comparison difference; and
   a light source adjusting circuit for receiving a fine adjustment control signal from said comparing/setting unit and changing an output of the beam emitted from said light source,
   wherein an output level of the output beam is detected at the output end side to reduce an error with respect to the set value.

10. An optical power meter calibrating system comprising;
a light source;
light source driving means for driving said light source;
optical level adjusting means for receiving output light from said light source and adjusting the level of the output light;
optical output means for externally outputting the output light from said optical level adjusting means;
optical output level setting means for setting the output light externally output from said optical output means to be a desired level;
a standard optical power meter and an optical power meter to be calibrated which are selectively, detachably connected to said optical output means; and
control means for comparing, when said standard optical power meter is connected to said optical output means, an optical output level set signal from said optical output level setting means with an output signal from said standard optical power meter to control said optical level adjusting means and said light source driving means so that a comparison error becomes zero, and after the comparison error becomes zero, for controlling to maintain the above control for said optical level adjusting means and said light source driving means until said standard optical power meter is disconnected to connect said optical power meter to be calibrated and calibration for said optical power meter to be calibrated is completed.

11. An optical power meter calibrating apparatus including a light source, an optical branch circuit for causing said light source to emit an optical signal and branching the emitted optical signal, an optical branch output detector for detecting one of the optical signal outputs from said optical branch circuit, a variable optical adjuster for receiving and adjusting the other optical signal output from said optical branch circuit, and a standard power meter for measuring the optical signal output from said variable optical adjuster, comprising:

calibration level setting means for setting a desired calibration point; and
a controller for receiving, when said standard power meter is connected to said variable optical adjuster, an output level signal from said standard power meter and a calibration level signal from said calibration level setting means and controlling said variable optical adjuster so that a difference between both the signals becomes zero,
wherein when the output from said optical branch output circuit is substantially kept unchanged while said standard power meter is disconnected to connect a power meter to be calibrated to said variable optical adjuster and calibration is completed, said power meter to be calibrated is calibrated.

12. An optical power meter calibrating apparatus including a stabilized light source an optical power level of which is controlled by a control signal, an optical branch circuit for causing said stabilized light source to emit an optical signal and branching the emitted optical signal, an optical branch output detector for detecting one of the optical signal outputs from said optical branch circuit, a variable optical adjuster for receiving and adjusting the other optical signal output from said optical branch circuit, and a standard power meter for measuring the optical signal output from said variable optical adjuster, comprising:
calibration level setting means for setting a desired calibration point; a first controller for receiving, when said standard power meter is connected to said variable optical adjuster, an output level signal from said standard power meter and a calibration level signal from said calibration level setting means and controlling said variable optical adjuster so that a difference between both the signals becomes zero; and a second controller for supplying a control signal to said stabilized light source so that the output from said optical branch output circuit is substantially kept unchanged while said standard power meter is disconnected to connect a power meter to be calibrated to said variable optical adjuster and calibration is completed.

* * * * *